(12) United States Patent
Tega

(10) Patent No.: US 12,306,210 B2
(45) Date of Patent: May 20, 2025

(54) MULTILAYER CIRCUIT BOARD WITH OFFSET CONNECTION PADS AND INCLINED INTERNAL CONDUCTORS FOR ENHANCED ELECTRICAL CONNECTIVITY

(71) Applicant: KYOCERA Corporation, Kyoto (JP)

(72) Inventor: Hitoshi Tega, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 37 days.

(21) Appl. No.: 18/017,128

(22) PCT Filed: Jul. 28, 2021

(86) PCT No.: PCT/JP2021/027932
§ 371 (c)(1),
(2) Date: Jan. 20, 2023

(87) PCT Pub. No.: WO2022/025128
PCT Pub. Date: Feb. 3, 2022

(65) Prior Publication Data
US 2023/0266363 A1 Aug. 24, 2023

(30) Foreign Application Priority Data
Jul. 29, 2020 (JP) .................................. 2020-127820

(51) Int. Cl.
*G01R 1/073* (2006.01)
*H05K 1/02* (2006.01)
*H05K 1/11* (2006.01)

(52) U.S. Cl.
CPC ......... *G01R 1/07342* (2013.01); *H05K 1/025* (2013.01); *H05K 1/0298* (2013.01);
(Continued)

(58) Field of Classification Search
CPC ............ G01R 1/07342; G01R 1/07378; G01R 31/2889; H05K 1/025; H05K 1/0298;
(Continued)

(56) References Cited

U.S. PATENT DOCUMENTS

2008/0265921 A1* 10/2008 Murata .............. G01R 1/07314
324/754.07
2011/0232953 A1* 9/2011 Oga ..................... H05K 3/4602
174/258

FOREIGN PATENT DOCUMENTS

EP 2493272 A 8/2012
JP 2004-265883 A 9/2004
(Continued)

*Primary Examiner* — Farhana A Hoque
(74) *Attorney, Agent, or Firm* — Volpe Koenig

(57) ABSTRACT

A circuit board includes an insulating substrate including a wiring conductor and a first resin substrate that is made of a resin different from the insulating substrate and is laminated on the insulating substrate. The first resin substrate has a plurality of internal conductors located from a surface thereof facing the insulating substrate to a surface on a side opposite to the insulating substrate. Each of the plurality of internal conductors includes a part that is inclined with respect to a perpendicular to the surface facing the insulating substrate. Intervals at which the plurality of internal conductors are located on the side opposite to the insulating substrate are narrower than intervals at which the plurality of internal conductors are located on an insulating substrate side.

20 Claims, 4 Drawing Sheets

(52) U.S. Cl.
CPC ... *H05K 1/119* (2013.01); *H05K 2201/09445* (2013.01); *H05K 2201/09609* (2013.01); *H05K 2201/09672* (2013.01)

(58) Field of Classification Search
CPC ......... H05K 1/119; H05K 2201/09445; H05K 2201/09609; H05K 2201/09672; H05K 3/4007; H05K 3/4688
See application file for complete search history.

(56) References Cited

FOREIGN PATENT DOCUMENTS

| | | | |
|---|---|---|---|
| JP | 2007-096246 | A | 4/2007 |
| JP | 2007-123595 | A | 5/2007 |
| JP | 2008-275409 | A | 11/2008 |
| JP | 2015-508240 | A | 3/2015 |
| JP | 2016-045092 | A | 4/2016 |
| JP | 2018-186222 | A | 11/2018 |
| KR | 10-2014-0030905 | A | 3/2014 |
| WO | 2011/048858 | A1 | 4/2011 |
| WO | 2013/126269 | A1 | 8/2013 |
| WO | 2017/057542 | A1 | 4/2017 |

\* cited by examiner

MULTILAYER CIRCUIT BOARD WITH OFFSET CONNECTION PADS AND INCLINED INTERNAL CONDUCTORS FOR ENHANCED ELECTRICAL CONNECTIVITY

TECHNICAL FIELD

The present disclosure relates to a circuit board and a probe card.

BACKGROUND

Japanese Unexamined Patent Application Publication No. 2018-186222 discloses a probe card in which a resin substrate and a ceramic substrate are laminated and a plurality of probe pins are connected to the resin substrate. A plurality of internal conductors is located in the resin substrate. Intervals at which the plurality of internal conductors are located are narrow on a probe pin side and wide on a ceramic insulating substrate side. Each of the internal conductors includes a thin-film conductor extending on a lamination surface of a resin insulating layer constituting the resin substrate and a through conductor passing through the resin insulating layer, and the thin-film conductor and the through conductor are combined to form a step-like shape.

SUMMARY

A circuit board according to the present disclosure includes an insulating substrate and a first resin substrate. The insulating substrate includes a wiring conductor. The first resin substrate is made of a resin different from the insulating substrate and is laminated on the insulating substrate. The first resin substrate has a plurality of internal conductors located from a surface thereof facing the insulating substrate to a surface on a side opposite to the insulating substrate. Each of the plurality of internal conductors includes a part that is inclined with respect to a perpendicular to the surface facing the insulating substrate. Intervals at which the plurality of internal conductors are located on the side opposite to the insulating substrate are narrower than intervals at which the plurality of internal conductors are located on an insulating substrate side.

A probe card according to the present disclosure includes the circuit board and a plurality of probe pins. The plurality of probe pins is connected to the circuit board.

DETAILED DESCRIPTION

Embodiments of the present disclosure are described in detail below with reference to the drawings.

Embodiment 1

Figure 1A:
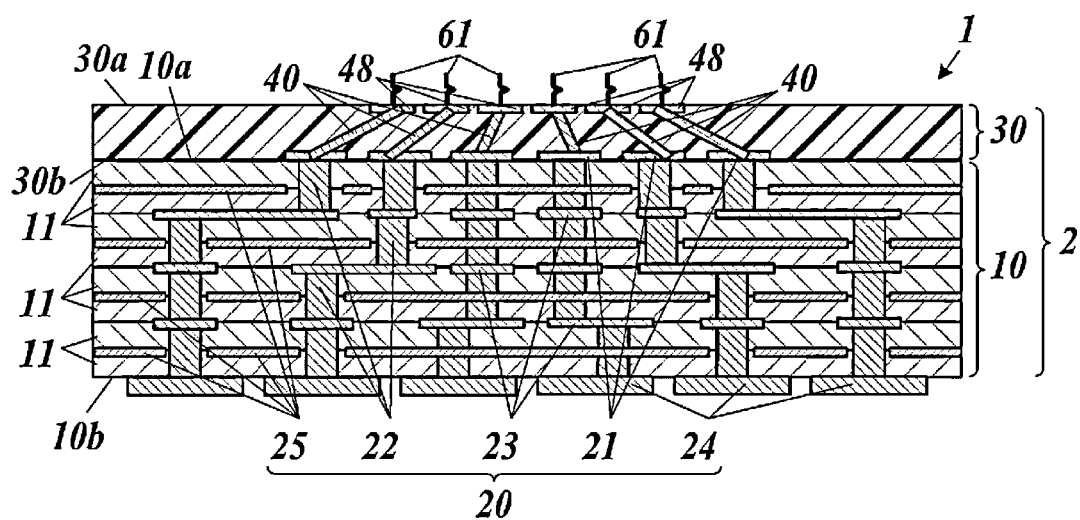
FIG. 1A is a longitudinal sectional view illustrating a circuit board and a probe card according to Embodiment 1 of the present disclosure.
Figure 1B:
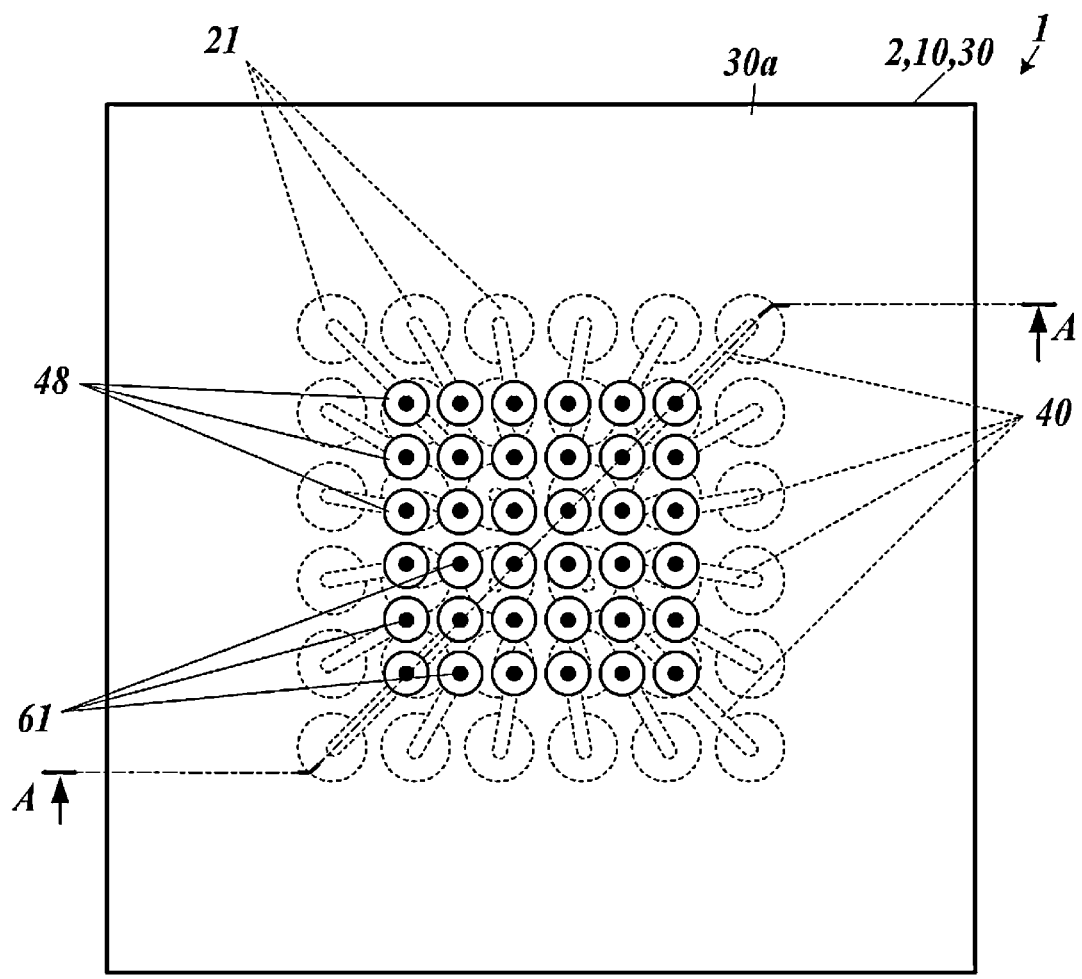
FIG. 1B is a plan view illustrating the circuit board and the probe card according to Embodiment 1 of the present disclosure.
Figure 1C:
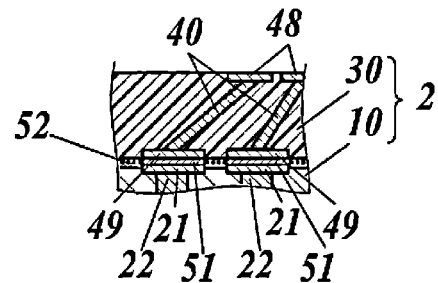
FIG. 1C is a longitudinal sectional view illustrating a variation of a joining portion in the circuit board and the probe card according to Embodiment 1 of the present disclosure.

FIG. 1A is a longitudinal sectional view illustrating a circuit board and a probe card according to Embodiment 1 of the present disclosure. FIG. 1B is a plan view illustrating the circuit board and the probe card according to Embodiment 1 of the present disclosure. FIG. 1C is a longitudinal sectional view illustrating a variation of a joining portion in the circuit board and the probe card according to Embodiment 1 of the present disclosure. FIG. 1A corresponds to a section taken along line A-A in FIG. 1B.

In Embodiment 1 of the present disclosure, a probe card 1 is a constituent component incorporated into a testing device for a semiconductor wafer (specifically, a plurality of semiconductor elements on the semiconductor wafer). The probe card 1 is interposed between a signal processing circuit to and from which a signal or voltage for testing is input or output and a wafer to be tested, and a plurality of probe pins 61 make contact with electrodes of the semiconductor elements. The probe card 1 includes a circuit board 2 and the plurality of probe pins 61 each of which is connected to a respective one of a plurality of connection pads 48 of the circuit board 2. The circuit board 2 includes an insulating substrate 10 and a resin substrate 30 laminated on the insulating substrate 10. The resin substrate 30 corresponds to an example of a first resin substrate according to the present disclosure.

The insulating substrate 10 includes a plurality of insulating layers 11 that are laminated on one another. Each of the insulating layers 11 is made of ceramic. The insulating substrate 10 includes wiring conductors 20. The wiring conductors 20 include a solid conductor 25 and a film conductor 23 that extend on a lamination surface of each insulating layer 11 and a via conductor 22 that passes through one or more insulating layers 11. Furthermore, the wiring conductors 20 include a plurality of connection pads 21 located on a first substrate surface 10a (a surface facing the resin substrate 30) of the insulating substrate 10 and a plurality of external terminals 24 located on a second substrate surface 10b of the insulating substrate 10. The via conductor 22 extends in a direction perpendicular to the first substrate surface 10a and the second substrate surface 10b. The solid conductor 25 is a conductor to which a power-supply voltage or a ground voltage is supplied and occupies a larger area than the film conductor 23. In a case where a single layer includes the solid conductor 25 and the via conductor 22 or the film conductor 23 that are not conductive with each other, the solid conductor 25 is provided with a cutout, and the via conductor 22 and the film conductor 23 are located in the cutout. The plurality of external terminals 24, the plurality of film conductors 23, the plurality of via conductors 22, the plurality of solid conductors 25, and the plurality of connection pads 21 are connected in various patterns. Regarding a conductor to which a high-frequency signal is transmitted among the wiring conductors 20, impedance matching is achieved by disposing the solid conductor 25 in a neighboring layer.

The resin substrate 30 includes a single resin layer. The resin layer is, for example, made of polyimide. The resin substrate 30 includes a plurality of internal conductors 40 and the plurality of connection pads 48.

Each of the internal conductors 40 is located from a first substrate surface 30a of the resin substrate 30 to a second substrate surface 30b opposite to the first substrate surface 30a. The second substrate surface 30b faces the insulating substrate 10. Each of the plurality of internal conductors 40 includes a part that is inclined with respect to a perpendicular to the second substrate surface 30b. Specifically, each of the internal conductors 40 does not include a parallel part that extends in a direction parallel to the first substrate surface 30a, and each of the internal conductors 40 is inclined at a constant inclination angle from a first end to a second end on an opposite side and passes through the resin layer. An inclination angle of each of the plurality of internal conductors 40 is slightly different from that of an adjacent internal conductor 40. Therefore, the plurality of internal conductors 40 do not cross one another, and intervals at which the plurality of internal conductors 40 are located are narrow on the first substrate surface 30a side and wide on the second substrate surface 30b side.

The plurality of connection pads 48 are located on the first substrate surface 30a (a surface on a side opposite to the insulating substrate 10) of the resin substrate 30. Each of the plurality of connection pads 48 is connected to a respective one of the plurality of internal conductors 40 and is electrically connected to a respective one of the plurality of connection pads 21 of the insulating substrate 10 with the internal conductor 40 interposed therebetween. Due to the inclination of the plurality of internal conductors 40, a pitch of the plurality of connection pads 21 of the insulating substrate 10 can be increased, and a pitch of the plurality of connection pads 48 of the resin substrate 30 can be decreased.

Note that although an example in which all of the plurality of internal conductors 40 are inclined with respect to a perpendicular to the second substrate surface 30b is illustrated in FIG. 1A, a configuration in which some internal conductors 40 are inclined (or include an inclined part) and other internal conductors 40 are not inclined (or do not include an inclined part) may be employed. The other internal conductors 40 may be through conductors that extend in a direction along the perpendicular to the second substrate surface 30b or may be conductors extending in a stepwise manner.

Method for Producing Circuit Board

As a material of the insulating layers 11, a ceramic sintered body such as an aluminum oxide sintered body, an aluminum nitride sintered body, a silicon carbide sintered body, a mullite sintered body, or glass ceramics can be applied, for example. In a case where an aluminum oxide sintered body is applied as the material of the insulating layers 11, the insulating substrate 10 can be produced as follows. First, raw material powder mainly containing aluminum oxide powder and powder of silicon oxide or the like, which is a sintering aid component, is kneaded together with an organic solvent and a binder into a slurry, and this slurry is molded into a sheet shape by a molding method such as a doctor blade method or a lip coater method to produce a ceramic green sheet (hereinafter also referred to as a green sheet), which will become the insulating layer 11.

Next, a plurality of green sheets thus produced are laminated to produce a laminated body. Then, this laminated body is fired at a temperature of approximately 1300° C. to 1600° C. In this way, the insulating substrate 10 can be produced.

The wiring conductors 20 contain, for example, a metal material such as tungsten, molybdenum, manganese, or copper or an alloy of these metal materials as a conductor component. In a case where the connection pads 21, the film conductors 23, the external terminals 24, and the solid conductors 25 are, for example, tungsten metallization layers, the connection pads 21, the film conductors 23, the external terminals 24, and the solid conductors 25 can be produced by a method of producing metal paste by mixing tungsten powder with an organic solvent and an organic binder, printing the metal paste thus produced at a predetermined position of the green sheet, which will become the insulating layer 11, by a method such as a screen printing method, and firing the metal paste together with the green sheet. Each of the via conductors 22 can be formed by forming a through-hole at a predetermined position of the green sheet before the printing of the metal paste and then filling the through-hole with metal paste same as and/or similar to the metal paste described above. On a surface of an exposed conductor layer such as the connection pads 21 and the external terminals 24, a nickel film of approximately 1 μm to 10 μm and a gold film of approximately 0.1 μm to 3 μm are sequentially formed. This can protect the surface of the exposed conductor layer and increase joining performance of a brazing filler metal, solder, or the like. The nickel film and the gold film can be formed of a plating film formed by electrolytic plating or a thin film.

The resin substrate 30 can be produced as follows. First, the plurality of internal conductors 40 each of which extends from a respective one of the plurality of connection pads 21 at an angle and the plurality of connection pads 48 each of which is provided on a respective one of the plurality of internal conductors 40 are formed on the connection pads 21 of the insulating substrate 10 by using a 3D printer. Then, portions around the plurality of internal conductors 40 are filled with an uncured resin from the first substrate surface 10a of the insulating substrate 10 to a height of the plurality of connection pads 48, and the resin is cured. Through these steps, the resin substrate 30 integrated with the insulating substrate 10 can be produced. Note that the resin substrate 30 can also be produced by forming a resin portion simultaneously with the formation of the internal conductors 40 by using a 3D printer.

Alternatively, the resin substrate 30 can be produced as follows. First, a single resin layer is formed, and a plurality of inclined through-holes are formed in the resin layer by using a laser. Next, the plurality of internal conductors 40 are formed by filling the plurality of through-holes with electrically conductive paste and then curing the electrically conductive paste. Furthermore, the plurality of connection pads 48 are formed by screen-printing electrically conductive paste on a first surface of the resin layer and then curing the electrically conductive paste or by thin film formation. Furthermore, a plurality of connection pads 49 (FIG. 1C) are formed by screen-printing electrically conductive paste on a second surface of the resin layer on an opposite side and then curing the electrically conductive paste or by thin film formation. Through these steps, the resin substrate 30 can be produced separately from the insulating substrate 10. Note that the internal conductors 40 can also be formed by thin film formation (e.g., non-electrolytic plating). Then, as illustrated in FIG. 1C, each of the plurality of connection pads 49 of the resin substrate 30 is joined to a respective one of the plurality of connection pads 21 of the insulating substrate 10 with the use of an electrically conductive joining material 51 such as solder, and the second substrate surface 30b of the resin substrate 30 and the first substrate surface 10a of the insulating substrate 10 are joined with the use of an insulating joining material 52 such as an adhesive. Through these steps, the circuit board 2 in which the insulating substrate 10 and the resin substrate 30 are laminated on each other can be produced.

As described above, according to the circuit board 2 according to Embodiment 1, each of the internal conductors 40 of the resin substrate 30 includes a part inclined with respect to a perpendicular to the second substrate surface 30b. Due to the inclination of the internal conductors 40, intervals at which the plurality of internal conductors 40 are located are wide on the second substrate surface 30b side and narrow on the first substrate surface 30a side where the probe pins 61 are connected. Therefore, even in a case where the pitch of the plurality of connection pads 21 of the insulating substrate 10 is increased, each of the plurality of probe pins 61 arranged at a narrow pitch can be electrically connected to a respective one of the plurality of connection pads 21 of the insulating substrate 10 by interposing the resin substrate 30.

Since the pitch of the plurality of connection pads 21 of the insulating substrate 10 can be increased, freedom of design of the wiring conductors 20 improves and characteristics of the wiring conductors 20 can be improved in the insulating substrate 10. For example, regarding a line that transmits a high-frequency signal or a line for which improvement in isolation characteristics between lines is requested, impedance matching of the line can be achieved, and the request for isolation can be met by disposing the solid conductor 25 in a neighboring layer.

In the resin substrate 30 according to Embodiment 1, the structure in which the intervals at which the plurality of internal conductors 40 are located on the first substrate surface 30a side are different from the intervals at which the plurality of internal conductors 40 are located on the second substrate surface 30b side is realized by the inclination of the internal conductors 40. Therefore, the resin substrate 30 can be decreased in thickness, and the circuit board 2 and the probe card 1 can be decreased in height, compared with a case where the structure is realized by step-like internal conductors.

A wafer testing device is sometimes used to conduct an acceleration test in which a wafer is repeatedly heated and cooled. In a case where the acceleration test is conducted on a wafer, a stress fluctuation resulting from a difference in thermal expansion between the insulating substrate 10 and the resin substrate 30 is repeatedly applied to the insulating substrate 10 and the resin substrate 30. However, according to the resin substrate 30 according to Embodiment 1, the internal conductors 40 have high durability against the stress fluctuation. In addition, since the resin substrate 30 can be decreased in thickness, the stress fluctuation decreases. This can further improve reliability of the circuit board 2 and the probe card 1.

Embodiment 2

Figure 2:
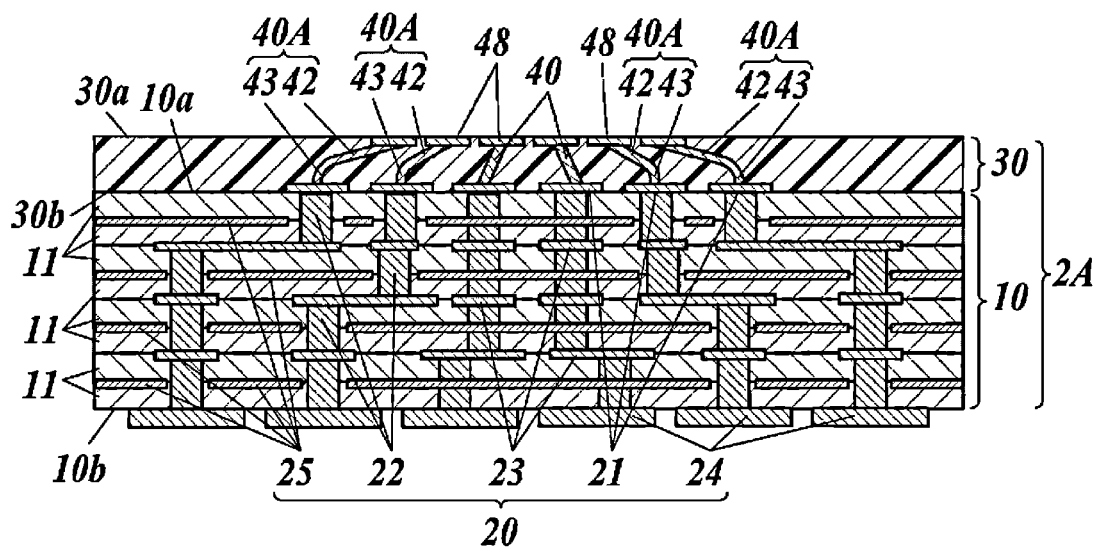
FIG. 2 is a longitudinal sectional view illustrating a circuit board according to Embodiment 2 of the present disclosure.

FIG. 2 is a longitudinal sectional view illustrating a circuit board according to Embodiment 2 of the present disclosure. A circuit board 2A according to Embodiment 2 is same as and/or similar to Embodiment 1 except for a wiring pattern of some internal conductors 40A.

Each of the internal conductors 40A that have a different wiring pattern includes an inclined part 42 that is inclined with respect to a perpendicular to a second substrate surface 30b and a perpendicular part 43 that extends in a direction along the perpendicular. The inclined part 42 and the perpendicular part 43 are linked in a single line. The perpendicular part 43 may be located on an insulating substrate 10 side, and the inclined part 42 may be located on a side opposite to the insulating substrate 10. The perpendicular part 43 may have a longer length as a distance from a center of a bundle of the plurality of internal conductors 40 and 40A increases. According to the circuit board 2A according to Embodiment 2, effects same as and/or similar to those of the circuit board 2 according to Embodiment 1 can be obtained. In addition, according to the circuit board 2A according to Embodiment 2, since a large distance can be ensured between adjacent two of the internal conductors 40 and 40A due to the internal conductors 40A each including the perpendicular part 43, isolation characteristics of each of the internal conductors 40 and 40A can be improved.

The circuit board 2A according to Embodiment 2 can be produced by a method of forming the internal conductors 40 and 40A by a 3D printer among the production methods of the circuit board 2 described in Embodiment 1.

Note that each of the internal conductors 40A according to Embodiment 2 may include one or more inclined parts 42 and one or more perpendicular parts 43. A linking portion between the inclined part 42 and the perpendicular part 43 may be gradually curved or may be bent.

Embodiment 3

Figure 3:
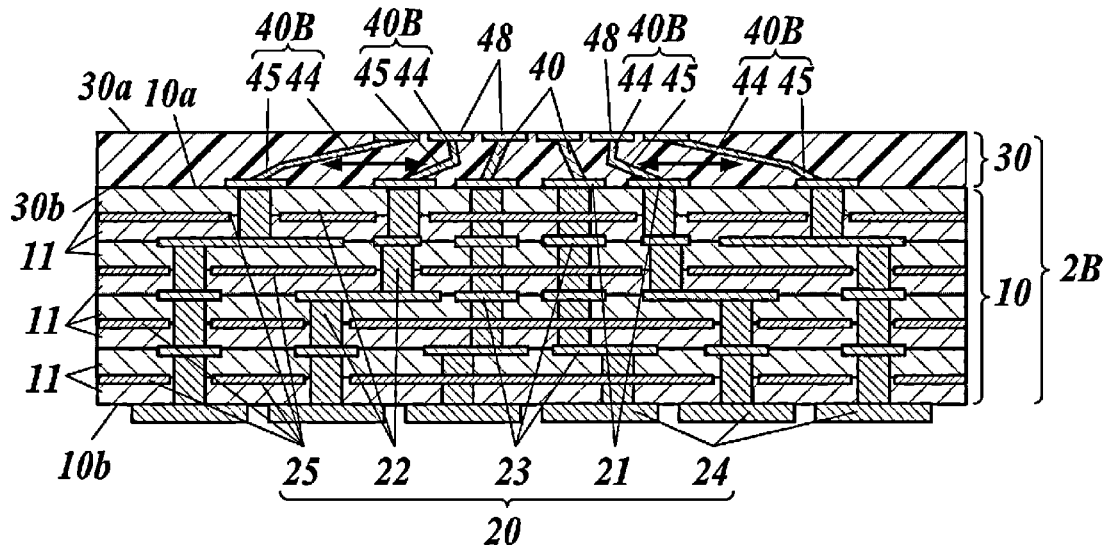
FIG. 3 is a longitudinal sectional view illustrating a circuit board according to Embodiment 3 of the present disclosure.

FIG. 3 is a longitudinal sectional view illustrating a circuit board according to Embodiment 3 of the present disclosure. A circuit board 2B according to Embodiment 3 is same as and/or similar to Embodiment 1 except for a wiring pattern of some internal conductors 40B.

Each of the internal conductors 40B that have a different wiring pattern includes a first inclined part 44 and a second inclined part 45 that are inclined at different angles with respect to a perpendicular to a second substrate surface 30b. The first inclined part 44 and the second inclined part 45 are linked in a single line. According to the circuit board 2B according to Embodiment 3, effects same as and/or similar to those of the circuit board 2 according to Embodiment 1 can be obtained. In addition, according to the circuit board 2B according to Embodiment 3, a distance between adjacent specific internal conductors 40B can be increased (a portion where the distance is increased is indicated by the arrow in FIG. 3) due to the internal conductors 40B each including the first inclined part 44 and the second inclined part 45. In a case where it is desired to further increase isolation characteristics of a specific internal conductor 40 or 40B, such a request can be met.

The circuit board 2B according to Embodiment 3 can be produced by a method of forming the internal conductors 40 and 40B by a 3D printer among the production methods of the circuit board 2 described in Embodiment 1.

Note that each of the internal conductors 40B according to Embodiment 3 may include three or more inclined parts that are linked to one another, and adjacent two of the three or more inclined parts have different inclination angles. Each of the internal conductors 40B according to Embodiment 3 may include a plurality of inclined parts and a perpendicular part 43 that are linked to one another, and adjacent two of the three or more inclined parts have different inclination angles. A linking portion where an inclination angle changes may be gradually curved or may be bent. Each of the internal conductors 40B may include a part whose inclination angle successively changes. An inclination angle of each of the internal conductors 40B from a first end to a second end on an opposite side may successively change. In the above case, a part within a range where the inclination angle successively changes corresponds to a first inclined part, and the other part within the range corresponds to a second inclined part.

Embodiment 4

Figure 4A:
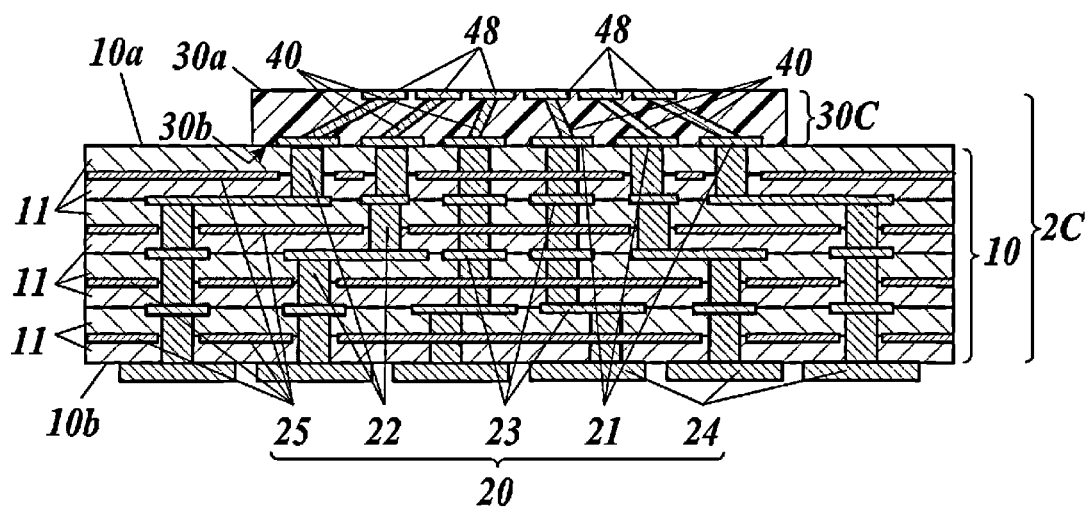
FIG. 4A is a longitudinal sectional view illustrating a circuit board according to Embodiment 4 of the present disclosure.
Figure 4B:
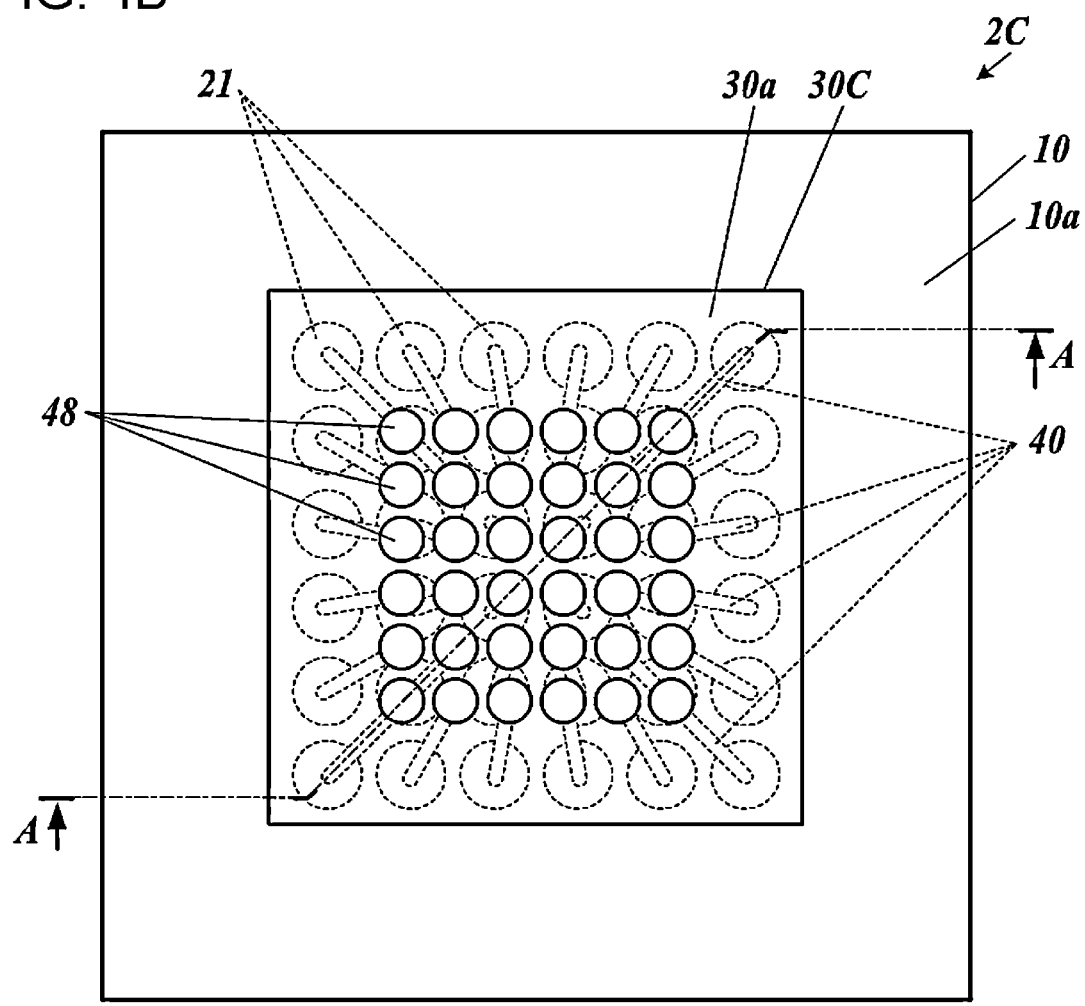
FIG. 4B is a plan view illustrating the circuit board according to Embodiment 4 of the present disclosure.

FIG. 4A is a longitudinal sectional view illustrating a circuit board according to Embodiment 4 of the present disclosure. FIG. 4B is a plan view illustrating the circuit board according to Embodiment 4 of the present disclosure. FIG. 4A corresponds to a section taken along line A-A in FIG. 4B. According to a circuit board 2C according to Embodiment 4, an area of a resin substrate 30C in plan view is smaller than an area of an insulating substrate 10 in plan view. The resin substrate 30C is located inside an entire periphery of the insulating substrate 10 when viewed in a direction perpendicular to a second substrate surface 30b. Other constituent elements are same as and/or similar to those in Embodiments 1 to 3. According to the circuit board 2C according to Embodiment 4, effects same as and/or similar to those of the circuit board 2 according to Embodiment 1 can be obtained. The resin substrate 30C corresponds to an example of a first resin substrate according to the present disclosure.

When a temperature of the circuit board 2C changes, stress resulting from a difference in coefficient of thermal expansion is generated between the insulating substrate 10 and the resin substrate 30C. However, according to the circuit board 2C according to Embodiment 4, a dimension (a dimension in a biaxial direction along the second substrate surface 30b) of a resin layer of the resin substrate 30C is small. Therefore, the stress decreases, and reliability of joining can be improved in a joining portion between the resin substrate 30C and the insulating substrate 10 or a joining portion between wiring conductors 20 of the insulating substrate 10 and wiring conductors (connection pads 21 and internal conductors 40) of the resin substrate 30C.

The configuration of Embodiment 4 in which the dimension (the dimension in the biaxial direction along the second substrate surface 30b) of the resin layer of the resin substrate 30C is smaller than that of a first substrate surface 10a of the insulating substrate 10 is also applicable to embodiments that will be described later.

Embodiment 5

Figure 5:
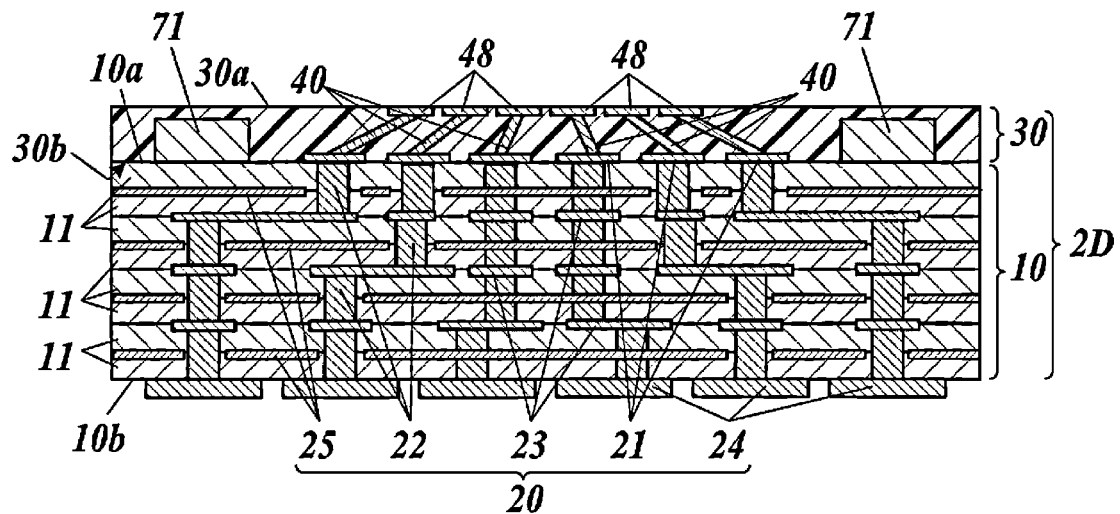
FIG. 5 is a longitudinal sectional view illustrating a circuit board according to Embodiment 5 of the present disclosure.

FIG. 5 is a longitudinal sectional view illustrating a circuit board according to Embodiment 5 of the present disclosure. According to a circuit board 2D according to Embodiment 5, an electric element 71 is mounted on an insulating substrate 10 and a resin layer of a resin substrate 30 covers the electric element 71. Other constituent elements are same as and/or similar to those in Embodiments 1 to 3. As the electric element 71, a capacitor, a coil, or the like that is electrically connected to a solid conductor 25 to which a power-supply voltage or a ground voltage is supplied and attenuates power-supply noise or the like may be applied. An upper part and all side parts of the electric element 71 are covered with the resin layer.

According to the circuit board 2D according to Embodiment 5, effects same as and/or similar to those of the circuit board 2 according to Embodiment 1 can be obtained. In addition, according to the circuit board 2D according to Embodiment 5, the resin layer of the resin substrate 30 can be used as a protection member of the electric element 71. In addition, the electric element 71 can be mounted on the insulating substrate 10 without protruding from the circuit board 2D. This is advantageous in that the electric element 71 and the circuit board 2D are less likely to receive mechanical damage.

The resin layer covering the electric element 71 can be formed by filling portions on the insulating substrate 10 and around the electric element 71 with an uncured resin after the electric element 71 is mounted on the insulating substrate 10 and internal conductors 40 and other members are formed by a 3D printer and then curing the resin. Alternatively, the configuration in which the resin layer of the resin substrate 30 covers the electric element 71 can be realized by forming, in the resin layer of the resin substrate 30, a space in which the electric element 71 is to be accommodated in advance by die forming and then laminating and joining the resin substrate 30 on the insulating substrate 10 on which the electric element 71 is mounted.

Embodiment 6

Figure 6:
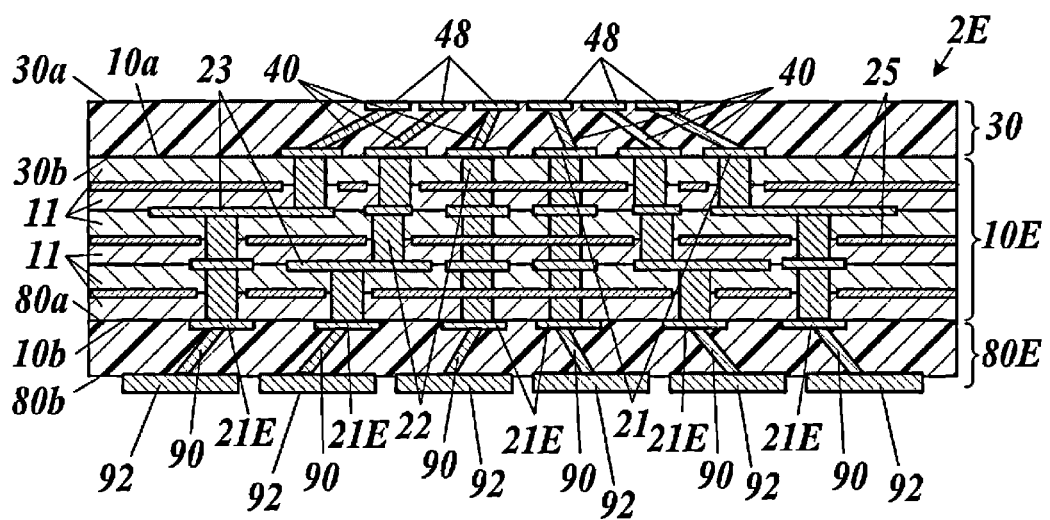
FIG. 6 is a longitudinal sectional view illustrating a circuit board according to Embodiment 6 of the present disclosure.

FIG. 6 is a longitudinal sectional view illustrating a circuit board according to Embodiment 6 of the present disclosure. According to a circuit board 2E according to Embodiment 6, resin substrates 30 and 80E are laminated on a first substrate surface 10a and a second substrate surface 10b of an insulating substrate 10E, respectively. The configuration of Embodiment 6 is same as and/or similar to the configurations of Embodiments 1 to 3 and 5 except for the added resin substrate 80E and a configuration of the insulating substrate 10E on a second substrate surface 10b side. The resin substrate 80E corresponds to an example of a second resin substrate according to the present disclosure.

The insulating substrate 10E includes a plurality of connection pads 21E located on the second substrate surface 10b instead of the plurality of external terminals 24.

The resin substrate 80E includes a single resin layer. The resin substrate 80E includes a plurality of internal conductors 90 and a plurality of external terminals 92. The plurality of internal conductors 90 are located from a first substrate surface 80a of the resin substrate 80E to a second substrate surface 80b on an opposite side. The plurality of external terminals 92 are located on the second substrate surface 80b of the resin substrate 80E on a side opposite to the insulating substrate 10E. Each of the plurality of external terminals 92 is connected to a respective one of the plurality of internal conductors 90 and is electrically connected to a respective one of the plurality of connection pads 21E of the insulating substrate 10E with the internal conductor 90 interposed therebetween. The resin substrate 80E does not include a solid conductor to which a power-supply voltage is supplied or a solid conductor that is grounded.

Each of the plurality of internal conductors 90 may include an inclined part as with the internal conductors 40, 40A, and 40B according to Embodiments 1 to 3 or may include no inclined part. Intervals at which the plurality of internal conductors 90 are located may be narrow on the insulating substrate 10E side and wide on a side opposite to the insulating substrate 10E. The resin substrate 80E may replace a wiring function in one insulating layer 11 of the insulating substrate 10E, and thereby the number of layers of the insulating substrate 10E may be reduced.

The resin substrate 80E can be produced by a method same as and/or similar to the production method of the resin substrate 30 described in Embodiment 1.

According to the circuit board 2E according to Embodiment 6, effects same as and/or similar to those of the circuit board 2 according to Embodiment 1 can be obtained. Furthermore, according to the circuit board 2E according to Embodiment 6, resin layers of the resin substrates 30 and 80E are joined to the first substrate surface 10a and the second substrate surface 10b of the insulating substrate 10, respectively. Therefore, warpage of the circuit board 2E resulting from stress can be reduced. Furthermore, the number of layers of the insulating substrate 10 can be reduced.

Embodiments have been described above. However, a circuit board and a probe card of the present disclosure are not limited to the above embodiments. For example, although the circuit boards 2 and 2A to 2E of the embodiments can be used as a circuit board of the probe card illustrated in Embodiment 1, application is not limited to a probe card, and the circuit boards 2 and 2A to 2E of the embodiments may be, for example, applied as a circuit board on which a flip chip or an electronic element having a plurality of external terminals arranged at a narrow pitch is mounted. Furthermore, the circuit board 2E according to Embodiment 6 can be applied to a double-sided mounting substrate having the flip chip, the electronic element, or the like mounted on both surfaces thereof. Details illustrated in the embodiments such as an internal structure of an insulating substrate, a material of an insulating layer, and a material of a resin layer of a resin substrate can be changed as appropriate.

INDUSTRIAL APPLICABILITY

The present disclosure can be applied to a circuit board and a probe card.

REFERENCE SIGNS 1 probe card
2, 2A to 2E circuit board
10, 10E insulating substrate
10a first substrate surface
10b second substrate surface
11 insulating layer
20 wiring conductor
21, 21E connection pad
22 via conductor
23 film conductor
24 external terminal
25 solid conductor
30, 30C resin substrate (first resin substrate)
30a first substrate surface
30b second substrate surface
40, 40A, 40B internal conductor
42 inclined part
43 perpendicular part
44 first inclined part
45 second inclined part
48 connection pad
49 connection pad
51 electrically conductive joining material
52 insulating joining material
61 probe pin
71 electric element
80E resin substrate (second resin substrate)
80a first substrate surface
80b second substrate surface
90 internal conductor
92 external terminal

The invention claimed is:

1. A circuit board comprising:
an insulating substrate including a wiring conductor;
a first resin substrate that is made of a resin different from the insulating substrate and is laminated on the insulating substrate in a thickness direction, wherein the first resin substrate extends along a first direction that is orthogonal to the thickness direction;
a first plurality of connection pads;
a second plurality of connection pads that face the insulating substrate, wherein the first plurality of connection pads are offset in a thickness direction of the first resin substrate; and
a plurality of internal conductors formed in the first resin substrate that each electrically connect a respective first connection pad among the first plurality of connection pads and a respective second connection pad among the second plurality of connection pads,
wherein each of the plurality of internal conductors includes:
a first part that electrically couples to the first respective connection pad and is inclined with respect to the thickness direction
wherein the plurality of internal conductors includes internal conductors that further include:
a second part that electrically couples to the second respective connection pad and extends along the thickness direction, wherein a length of the second part in the thickness direction increases as a distance along the first direction from a respective internal conductor to a center of the first resin substrate increases, and
wherein a distance separating each of the first plurality of connection pads along a side opposite to the insulating substrate in the first direction is narrower than a distance separating each of the second plurality of connection pads in the first direction.

2. The circuit board according to claim 1, wherein the first part of at least one of the plurality of internal conductors is inclined with a different inclination angle.

3. The circuit board according to claim 2, wherein the plurality of internal conductors does not have a parallel part that extends parallel to a surface facing the insulating substrate.

4. The circuit board according to claim 2, wherein the first resin substrate is located inside an entire periphery of the insulating substrate when viewed in a direction along a perpendicular to a surface facing the insulating substrate.

5. The circuit board according to claim 2, wherein
an electric element is mounted on a first resin substrate side of the insulating substrate; and
the first resin substrate covers the electric element.

6. The circuit board according to claim 1, wherein
the plurality of internal conductors does not have a parallel part that extends along the first direction.

7. The circuit board according to claim 1, wherein
the first resin substrate is located inside an entire periphery of the insulating substrate when viewed in a direction along the thickness direction.

8. The circuit board according to claim 1, wherein
an electric element is mounted on a first resin substrate side of the insulating substrate; and
the first resin substrate covers the electric element.

9. The circuit board according to claim 1, further comprising a second resin substrate that is made of a resin different from the insulating substrate and is laminated on the insulating substrate on the side opposite to the first resin substrate,
- wherein the second resin substrate includes a third plurality of internal conductors located from an insulating substrate side to an opposite side.

10. A probe card comprising:
the circuit board according to claim 1; and
a plurality of probe pins connected to the circuit board.

11. A circuit board comprising:
an insulating substrate including a wiring conductor;
a first resin substrate that is made of a resin different from the insulating substrate and is laminated on the insulating substrate in thickness direction, wherein the first resin substrate extends along a first direction that is orthogonal to the thickness direction;
a first plurality of connection pads;
a second plurality of connection pads that face the insulating substrate, wherein the first plurality of connection pads are offset in a thickness direction of the first resin substrate;
a plurality of internal conductors formed in the first resin substrate that each electrically connect a respective first connection pad among the first plurality of connection pads and a respective second connection pad among the second plurality of connection pads,
wherein each of the plurality of internal conductors includes:
- a first part that electrically couples to the first respective connection pad and is inclined with respect to the thickness direction,
wherein the plurality of internal conductors include a first internal conductor and a second internal conductor that are adjacent to each other and are located on one side from a center of the plurality of internal conductors,
wherein the plurality of internal conductors include internal conductors that further include:
- a second part that is inclined with respect to the thickness direction in a different direction than the first part,
wherein the second part is located on an insulating substrate side and the first part is located on a side opposite the insulating substrate side,
wherein the first part of the first internal conductor and the first part of the second internal conductor are inclined to opposite sides relative to the thickness direction, and the second part of the first internal conductor and the second part of the second internal conductor are inclined to a same side relative to the thickness direction, and
wherein a distance separating each of the first plurality of connection pads along a side opposite to the insulating substrate are narrower than a distance separating each of the second plurality of connection pads.

12. The circuit board according to claim 11, wherein
at least one of the plurality of internal conductors includes a perpendicular part extending in a direction along the thickness direction.

13. The circuit board according to claim 12, wherein the plurality of internal conductors does not have a parallel part that extends parallel to a surface facing the insulating substrate.

14. The circuit board according to claim 12, wherein the first resin substrate is located inside an entire periphery of the insulating substrate when viewed in a direction along a perpendicular to a surface facing the insulating substrate.

15. The circuit board according to claim 12, wherein
an electric element is mounted on a first resin substrate side of the insulating substrate; and
the first resin substrate covers the electric element.

16. The circuit board according to claim 11, wherein
the plurality of internal conductors does not have a parallel part that extends along the first direction.

17. The circuit board according to claim 11, wherein
the first resin substrate is located inside an entire periphery of the insulating substrate when viewed in a direction along the thickness direction.

18. The circuit board according to claim 11, wherein
an electric element is mounted on a first resin substrate side of the insulating substrate; and
the first resin substrate covers the electric element.

19. The circuit board according to claim 11, further comprising a second resin substrate that is made of a resin different from the insulating substrate and is laminated on the insulating substrate on the side opposite to the first resin substrate,
wherein the second resin substrate includes a third plurality of internal conductors located from an insulating substrate side to an opposite side.

20. A probe card comprising:
the circuit board according to claim 18; and
a plurality of probe pins connected to the circuit board.

* * * * *